United States Patent
Wu et al.

(10) Patent No.: US 9,263,601 B2
(45) Date of Patent: Feb. 16, 2016

(54) ENHANCED ADHESION OF SEED LAYER FOR SOLAR CELL CONDUCTIVE CONTACT

(71) Applicants: Junbo Wu, San Jose, CA (US); Michael C. Johnson, Alameda, CA (US); Michael Cudzinovic, Sunnyvale, CA (US); Joseph Behnke, San Jose, CA (US); Xi Zhu, Milpitas, CA (US); David D. Smith, Campbell, CA (US); Richard Sewell Hamilton, Los Altos, CA (US); Xiuwen Tu, San Jose, CA (US); Seung Bum Rim, Palo Alto, CA (US)

(72) Inventors: Junbo Wu, San Jose, CA (US); Michael C. Johnson, Alameda, CA (US); Michael Cudzinovic, Sunnyvale, CA (US); Joseph Behnke, San Jose, CA (US); Xi Zhu, Milpitas, CA (US); David D. Smith, Campbell, CA (US); Richard Sewell Hamilton, Los Altos, CA (US); Xiuwen Tu, San Jose, CA (US); Seung Bum Rim, Palo Alto, CA (US)

(73) Assignee: SunPower Corporation, San Jose, CA (US)

(*) Notice: Subject to any disclaimer, the term of this patent is extended or adjusted under 35 U.S.C. 154(b) by 243 days.

(21) Appl. No.: 13/723,901

(22) Filed: Dec. 21, 2012

(65) Prior Publication Data

US 2014/0174518 A1 Jun. 26, 2014

(51) Int. Cl.
*H01L 31/042* (2014.01)
*H01L 31/0224* (2006.01)
*H01L 31/18* (2006.01)
*H01L 31/0216* (2014.01)

(52) U.S. Cl.
CPC .. *H01L 31/022425* (2013.01); *H01L 31/02167* (2013.01); *H01L 31/1864* (2013.01); *Y02E 10/50* (2013.01)

(58) Field of Classification Search
CPC ........ H01L 31/00–31/208; Y02E 10/50–10/60
USPC .................................................. 136/243–265
See application file for complete search history.

(56) References Cited

U.S. PATENT DOCUMENTS

| 2011/0197961 A1* | 8/2011 | Wu et al. ........................ 136/256 |
| 2012/0305063 A1* | 12/2012 | Moslehi et al. ............... 136/256 |
| 2012/0318349 A1* | 12/2012 | Shim et al. .................... 136/256 |

FOREIGN PATENT DOCUMENTS

| JP | 2006-066748 | 3/2006 |
| JP | 2006-261621 | 9/2006 |
| JP | 2008-198714 | 8/2008 |
| JP | 2009-021525 | 1/2009 |
| KR | 10-2002-0059189 | 7/2002 |

OTHER PUBLICATIONS

International Search Report and Written Opinion of the International Searching Authority dated Mar. 13, 2014, in International Patent Application No. PCT/US2013/072421.
International Preliminary Report on Patentability from PCT/US2013/072421 mailed Jul. 2, 2015, 9 pgs.

* cited by examiner

*Primary Examiner* — Bach Dinh
(74) *Attorney, Agent, or Firm* — Blakely Sokoloff Taylor Zafman LLP (57) ABSTRACT

Enhanced adhesion of seed layers for solar cell conductive contacts and methods of forming solar cell conductive contacts are described. For example, a method of fabricating a solar cell includes forming an adhesion layer above an emitter region of a substrate. A metal seed paste layer is formed on the adhesion layer. The metal seed paste layer and the adhesion layer are annealed to form a conductive layer in contact with the emitter region of the substrate. A conductive contact for the solar cell is formed from the conductive layer.

10 Claims, 7 Drawing Sheets

ENHANCED ADHESION OF SEED LAYER FOR SOLAR CELL CONDUCTIVE CONTACT

TECHNICAL FIELD

Embodiments of the present invention are in the field of renewable energy and, in particular, enhanced adhesion of seed layers for solar cell conductive contacts and methods of forming solar cell conductive contacts.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present invention allow for increased solar cell manufacture efficiency by providing novel processes for fabricating solar cell structures. Some embodiments of the present invention allow for increased solar cell efficiency by providing novel solar cell structures.

DETAILED DESCRIPTION

Enhanced adhesion of seed layers for solar cell conductive contacts and methods of forming solar cell conductive contacts are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithography and patterning techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of fabricating conductive contacts for solar cells. In an embodiment, a method of fabricating a solar cell includes forming an adhesion layer above an emitter region of a substrate. A metal seed paste layer is formed on the adhesion layer. The metal seed paste layer and the adhesion layer are annealed to form a conductive layer in contact with the emitter region of the substrate. A conductive contact for the solar cell is formed from the conductive layer. In another embodiment, a method of fabricating a solar cell includes forming a metal seed paste layer on an emitter region of a substrate. The metal seed paste layer is treated to increase adhesion of the metal seed paste layer on the emitter region of the substrate. Subsequently, a conductive contact for the solar cell is formed from the metal seed paste layer.

Also described herein are solar cells having conductive contacts. In an embodiment, a solar cell includes a substrate. An emitter region is disposed above the substrate. A conductive contact is disposed on the emitter region and includes a conductive layer in contact with the emitter region. The conductive layer is composed of a metal paste portion mixed with an adhesion layer portion. In another embodiment, a solar cell includes a substrate having a diffusion region at or near a surface of the substrate. A conductive contact is disposed above the diffusion region and includes a conductive layer in contact with the diffusion region. The conductive layer is composed of a metal paste portion mixed with an adhesion layer portion.

As a general overview of an application of embodiments described herein, FIGS. 1A-1D illustrate cross-sectional views of various operations in a method of fabricating a contact for a solar cell, in accordance with an embodiment of the present invention.

Figure 1A:
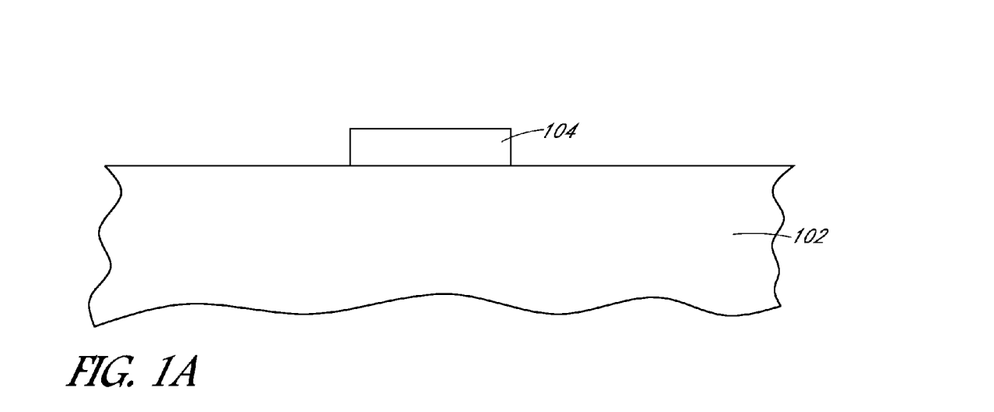
FIGS. 1A-1D illustrate cross-sectional views of various operations in a method of fabricating a contact for a solar cell, in accordance with an embodiment of the present invention.

Referring to FIG. 1A, a method of fabricating a solar cell includes forming an adhesion layer 104 above a substrate 102. In one embodiment, the adhesion layer 104 is formed on an emitter region disposed above a substrate, as described in greater detail below in association with FIGS. 2A and 3A-3C. The emitter region can be composed of, e.g., a doped polycrystalline silicon layer. In another embodiment, however, the adhesion layer 104 is formed on a surface of an N-type or P-type doped region of a bulk crystalline silicon substrate, as described in greater detail below in association with FIG. 2B. The bulk crystalline silicon substrate can be, e.g., an N-type bulk crystalline silicon substrate.

In an embodiment, the adhesion layer 104 is formed from a bottom anti-reflective coating (BARC) layer. In one such embodiment, the adhesion layer 104 is composed of a layer of material such as, but not limited to, amorphous silicon (a-Si), doped silicon, silicon-rich silicon nitride, silicon dioxide ($SiO_2$) or silicon oxynitride (SiON). In a specific such embodiment, an emitter region of substrate 102 is an N-type emitter region, and forming the adhesion layer involves forming a layer of P-type silicon.

In another embodiment, not shown, prior to forming the adhesion layer 104, a passivation layer is formed above the emitter region of the substrate 102, and the adhesion layer 104 is formed on the passivation layer. In one such embodiment, the adhesion layer is a BARC layer composed of amorphous silicon, and the passivation layer is composed of silicon nitride.

In yet another embodiment, also not shown, prior to forming the adhesion layer 104 above, e.g., an emitter region of substrate 102, a dielectric stack is formed above the emitter region. An opening is formed in the dielectric stack to expose a portion of the emitter region by using multi-pulse laser ablation, as is described in greater detail below in association with FIG. 4. In one such embodiment, the dielectric stack is formed by forming a dielectric layer (e.g., silicon oxide or silicon nitride) on the emitter region, and forming an absorptive layer on the dielectric layer. In a specific such embodiment, the absorptive layer is composed of amorphous silicon or silicon-rich silicon nitride.

Figure 1B:
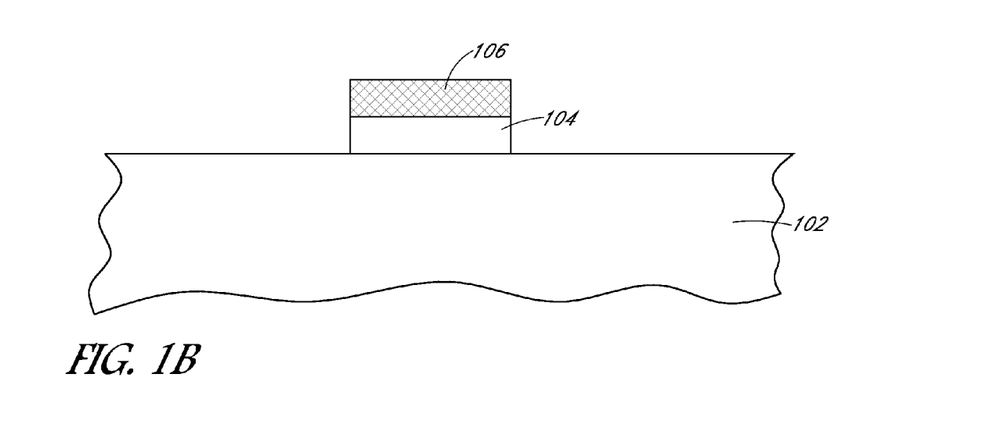

Referring to FIG. 1B, a metal seed paste layer 106 is formed on the adhesion layer 104. In an embodiment, the metal seed paste layer 106 is composed of aluminum/silicon (Al/Si) particles, binders, frit, and a solvent. In one such embodiment, the Al/Si particles are composed of less than approximately 25% Si, with the remainder of the composition made up by Al. In one embodiment, if included, the binders can be composed of zinc oxide (ZnO), tin oxide (SnO), or both, and the frit can be composed of glass particles.

One or both of the adhesion layer 104 and the metal seed paste layer 106 can be formed in a global deposition or as a patterned deposition, as depicted in FIGS. 1A and 1B. For example, in an embodiment, the metal seed paste layer 106 is formed on or above the adhesion layer 104 by printing using a technique such as, but not limited to, screen printing or ink-jet printing.

Figure 1C:
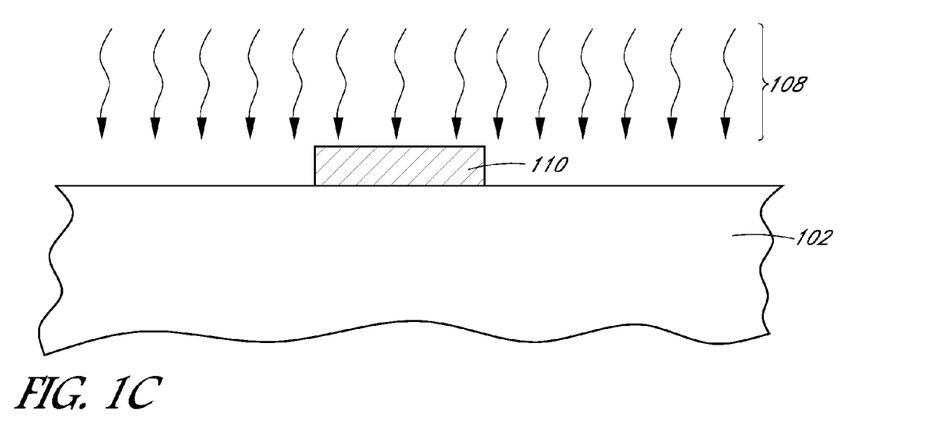

Referring to FIG. 1C, the metal seed paste layer 106 and the adhesion layer 104 are annealed 108 to form a conductive layer 110 in contact with the emitter region of the substrate 102. In an embodiment, annealing 108 the metal seed paste layer 106 and the adhesion layer 104 involves mixing the metal seed paste layer 106 and the adhesion layer 104 to form the conductive layer 110, as depicted in FIG. 1C.

In an embodiment, annealing 108 the metal seed paste layer 106 and the adhesion layer 104 involves firing at a temperature below approximately 600 degrees Celsius. In another embodiment, the adhesion layer 104 is formed from a layer of amorphous silicon (a-Si), the metal seed paste layer 106 is formed from a layer of aluminum (Al), and the annealing 108 involves forming an Al—Si alloy. In one such embodiment, annealing 108 the Al layer and the a-Si layer involves firing at a temperature above approximately 300 degrees Celsius, but below a eutectic temperature for an Al and Si mixture. In a specific embodiment, the adhesion layer 104 is formed on a silicon portion of an emitter region of substrate 102, and forming an Al—Si alloy involves mitigating damage to the silicon layer of the silicon portion of the emitter region.

In an embodiment, subsequent to forming the metal seed paste layer 106 on or above the adhesion layer 104 and prior to annealing 108 the metal seed paste layer 106, the metal seed paste layer 106 is dried by removing a solvent from the metal seed paste layer 106. However, in another embodiment, any solvent present in metal seed paste layer 106 is removed, e.g., by volatilization, during the annealing 108.

Figure 1D:
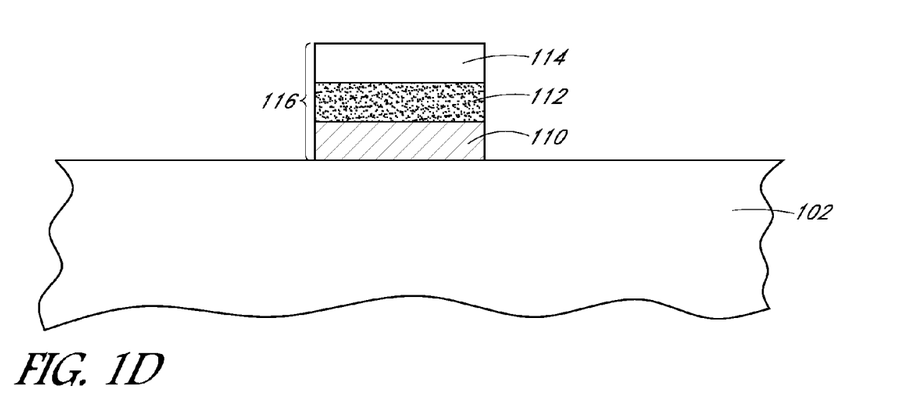

Referring to FIG. 1D, a conductive contact 116 for the solar cell is formed from the conductive layer 110. In an embodiment, a conductive back-contact is formed for an emitter region disposed above a substrate of the solar cell, e.g., on a polysilicon region, as described in greater detail below in association with FIGS. 2A and 3A-3C. In another embodiment, a conductive back-contact is formed for an N-type or P-type doped region of the substrate 102, as described in greater detail below in association with FIG. 2B. In an exemplary embodiment, referring again to FIG. 1D, forming the conductive contact 116 involves electroless plating a nickel (Ni) layer 112 on the conductive layer 110, and electroplating a copper (Cu) layer 114 on the Ni layer 112.

In another aspect, as mentioned briefly above, an amorphous silicon layer is used as a bARC layer for a solar cell. For example, amorphous silicon layer can be used as a bARC layer to provide passivation and moisture barrier to the substrate, and also enhance adhesion to a sputtered metal or printed metal film. Currently, a SiN layer is used as a bARC layer, which provides good moisture barrier and potentially passivation for substrate. However, adhesion between SiN and a metal seed layer is, in some circumstances, not great, especially since adhesion to printed metal seed is problematic at low firing temperatures.

In an embodiment, instead of using SiN, amorphous silicon layer can be used as bARC layer. Amorphous silicon can be deposited by PECVD, and the advantages include, but are not limited to (a) amorphous silicon layer is a good moisture barrier, which provides protection for a solar cell, (b) an amorphous silicon layer is a good passivation layer for a silicon substrate, and further provides electrical field passivation by heavy doping during deposition, (c) an amorphous silicon layer enhances adhesion of sputtered metal or printed metal to a wafer by forming a silicon-metal alloy, for example, a Si—Al alloy. Such an alloy can be used for the backside of an IBC cell, and also backside of front contact cells with back point contacts.

In another aspect, as mentioned briefly above, aluminum is known to form a better contact with p-type silicon than n-type silicon. Contact resistance of aluminum and n-type silicon is approximately 10 times higher than that of aluminum and n-type silicon for similar doping concentration. A thin p+ silicon layer can be formed on top of n+ diffusion layer, and then aluminum contact is formed on top of P+ layer instead of directly on top of n+ diffusion layer. The contact between aluminum and p+ silicon layer is ohmic, much better than aluminum and n+ diffusion. The junction between a p+ silicon layer and an n+ diffusion layer can further be used to form a tunneling junction when doping concentration is high, which behaves similar to ohmic contact. As a result, total contact resistance of Al/P+ layer/N+ diffusion can be better than contact resistance of Al/N+ diffusion (no P+ layer).

In an embodiment, a thin p+ silicon layer is formed on top of an n+ diffusion layer and, subsequently, an aluminum contact is formed on top of a p+ layer instead of directly on top of n+ diffusion layer. The contact between aluminum and p+ silicon layer is ohmic, much better than aluminum and n+ diffusion. The junction between p+ silicon layer and n+ diffusion layer can form a tunneling junction when doping concentration is high, which behaves similar to ohmic contact. As a result, total contact resistance of Al/p+ layer/n+ diffusion can be better than contact resistance of Al/n+ diffusion (no p+ layer). In one embodiment, the Al contact layer is formed by physical vapor deposition (PVD), printable paste or other suitable approaches. The n+ diffusion layer on silicon substrate can be single crystal or poly silicon. The thickness of p+ layer can be 5-100 nanometers, and doping concentration is >E19 cm-3. The p+ layer can be amorphous silicon or poly silicon. For example, the p+a-Si layer can be deposited by plasma enhanced chemical vapor deposition (PECVD).

Embodiments may be implemented when contact between aluminum and n+ diffusion layer is a limitation factor, e.g., if doping concentration of n+ diffusion layer is low, or cannot be improved due to other constraints. When aluminum is formed by screen printed paste, the contact quality may be worse than a corresponding PVD film. Accordingly, in one embodiment, the above approach can be applied to printed seed metallization processes. If p+ layer cannot be used in some cases, additional heavily doped n+ layer will help improve contact between Al/n-Si as well.

In another aspect, as mentioned briefly above, an a-Si layer is used as a sacrificial layer to mitigate silicon pitting. More specifically, to prevent pit formation on a silicon substrate, a layer of a-Si can be deposited on silicon substrate prior aluminum deposition. In one embodiment, the a-Si layer is preferably consumed by aluminum at elevated temperature, and the silicon substrate underneath is protected. In one such embodiment, a-Si is easier to be consumed by aluminum than single crystal silicon and ploy silicon. A tunneling barrier (e.g., a 10-15 Angstrom thick $SiO_2$ layer) can also be formed between a silicon substrate and the a-Si layer. In a particular embodiment, an a-Si layer is deposited following contact opening and, subsequently, an aluminum-based paste is printed and fired. A single layer of a-Si can also be considered as a bARC layer for the resulting devices.

More generally, it is well known that inter-diffusion occurs very fast at silicon-aluminum interface at elevated temperature, by which pits forms on silicon substrate. When these pits forms within contact opening our solar cells, wafer lifetime is degraded and thus the resulting devices are degraded and, possibly, even shorted. Pit formation is typically eliminated by including some silicon in the aluminum film, typically ~1%. For example, in an embodiment, an aluminum sputtering target has 1% Si and is used to prevent pit formation during anneal. However, in a specific embodiment, a significantly greater amount of silicon (approximately 25%) is needed along with the aluminum particles to reduce pitting resulting from higher firing temperatures. Thus, in one embodiment, to prevent pit formation on a silicon substrate (single crystal or poly) at elevated temperature when aluminum layer is deposited or aluminum paste is printed, a layer of a-Si is deposited on the silicon substrate prior to aluminum paste deposition.

As described briefly above, in a first approach, a metal seed paste having enhanced adhesion can be used to ultimately fabricate contacts, such as back-side contacts, for a solar cell having emitter regions formed above a substrate of the solar cell. For example, FIG. 2A illustrates a cross-sectional view of a portion of a solar cell having conductive contacts formed on emitter regions formed above a substrate, in accordance with an embodiment of the present invention.

Figure 2A:
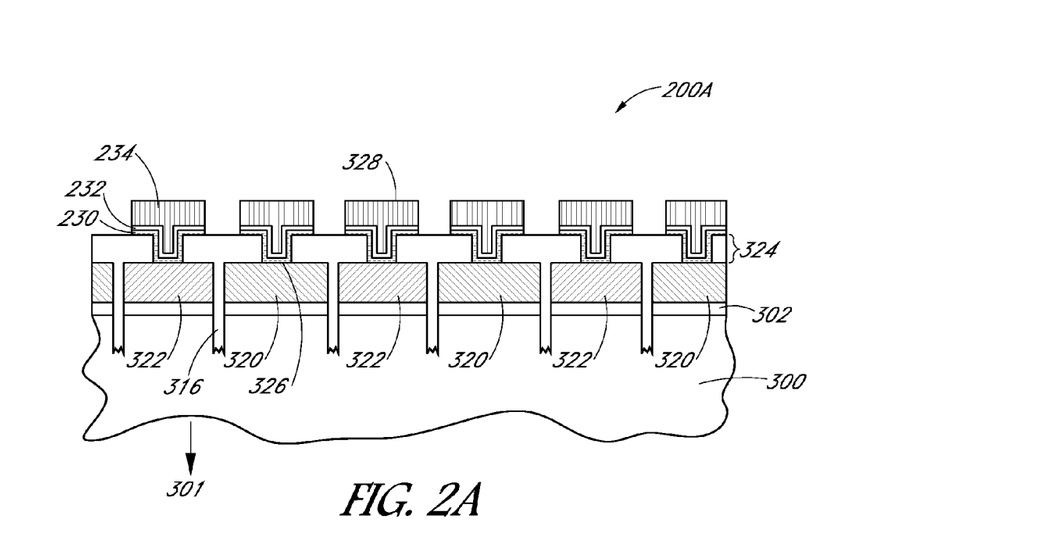
FIG. 2A illustrates a cross-sectional view of a portion of a solar cell having conductive contacts formed on emitter regions formed above a substrate, in accordance with an embodiment of the present invention.

Referring to FIG. 2A, a portion of a solar cell 200A includes a patterned insulating layer 324 disposed above a plurality of n-type doped polysilicon regions 320, a plurality of p-type doped polysilicon regions 322, and on portions of a substrate 300 exposed by trenches 316. Conductive contacts 328 are disposed in a plurality of contact openings disposed in the insulating layer 324 and are coupled to the plurality of n-type doped polysilicon regions 320 and to the plurality of p-type doped polysilicon regions 322. The materials of, and methods of fabricating, the patterned dielectric layer, the plurality of n-type doped polysilicon regions 320, the plurality of p-type doped polysilicon regions 322, the substrate 300, and the trenches 316 may be as described below in association with FIGS. 3A-3C. Furthermore, the plurality of n-type doped polysilicon regions 320 and the plurality of p-type doped polysilicon regions 322 can, in one embodiment, provide emitter regions for the solar cell 200A. Thus, in an embodiment, the conductive contacts 328 are disposed on the emitter regions. In an embodiment, the conductive contacts 328 are back contacts for a back-contact solar cell and are situated on a surface of the solar cell opposing a light receiving surface (direction provided as 301 in FIG. 2A) of the solar cell 200A. Furthermore, in one embodiment, the emitter regions are formed on a thin or tunnel dielectric layer 302, described in greater detail in association with FIG. 3A.

Referring again to FIG. 2A, each of the conductive contacts 328 includes a conductive layer 230 in contact with the emitter regions of the solar cell 200A. In an embodiment, the conductive layer 230 of contact 328 is composed of a metal paste portion mixed with an adhesion layer portion. In one such embodiment, the adhesion layer portion is composed of a bottom anti-reflective coating (BARC) portion. In a specific such embodiment, the adhesion layer portion further includes a passivation layer portion, e.g., in a particular embodiment, the BARC portion is composed of amorphous silicon, and the passivation layer portion is composed of silicon nitride. In another embodiment, the adhesion layer portion is composed of a material such as, but not limited to, amorphous silicon (a-Si), doped silicon, silicon-rich silicon nitride, silicon dioxide ($SiO_2$) or silicon oxynitride (SiON). In an embodiment, the metal paste portion is composed of aluminum (Al) and the adhesion layer portion is composed silicon (Si), and the resulting conductive layer is composed of an Al—Si alloy. In yet another embodiment, the adhesion layer portion is composed of a polymer glue. In another embodiment, the emitter regions are the N-type emitter regions, and the adhesion layer portion is composed of P-type silicon.

In an embodiment, the metal paste portion has a total composition including approximately 10-30% binders and frit, with the remainder the Al/Si particles. In one such embodiment, the binders are composed of zinc oxide (ZnO), tin oxide (SnO), or both, and the frit is composed of glass particles. It is to be understood that, when initially applied, a metal paste portion can further include a solvent. However, the solvent can be removed upon annealing the metal paste portion, leaving essentially the binders, frit and Al/Si particles mixed with the adhesion layer portion and disposed on the plurality of n-type doped polysilicon regions 320 and the plurality of p-type doped polysilicon regions 322. In an embodiment, an electroless plated nickel (Ni) layer 232 is disposed on the conductive layer 230, and an electroplated copper (Cu) layer 234 is disposed on the Ni layer, as depicted in FIG. 2A.

As also described briefly above, in a second approach, a metal seed paste having enhanced adhesion can be used to ultimately fabricate contacts, such as back-side contacts, for a solar cell having emitter regions formed in a substrate of the solar cell. For example, FIG. 2B illustrates a cross-sectional view of a portion of a solar cell having conductive contacts formed on emitter regions formed in a substrate, in accordance with another embodiment of the present invention.

Figure 2B:
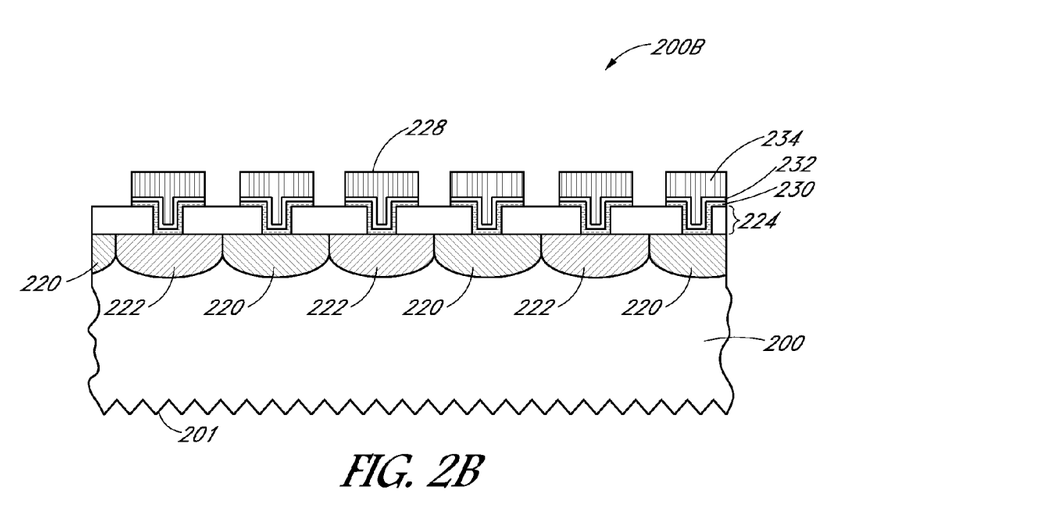
FIG. 2B illustrates a cross-sectional view of a portion of a solar cell having conductive contacts formed on emitter regions formed in a substrate, in accordance with another embodiment of the present invention.

Referring to FIG. 2B, a portion of a solar cell 200B includes a patterned insulating layer 224 disposed above a plurality of n-type doped diffusion regions 220, a plurality of p-type doped diffusion regions 222, and on portions of a substrate 200, such as a bulk crystalline silicon substrate. Conductive contacts 228 are disposed in a plurality of contact openings disposed in the insulating layer 224 and are coupled to the plurality of n-type doped diffusion regions 220 and to the plurality of p-type doped diffusion regions 222. In an embodiment, the diffusion regions 220 and 222 are formed by doping regions of a silicon substrate with n-type dopants and p-type dopants, respectively. Furthermore, the plurality of n-type doped diffusion regions 220 and the plurality of p-type doped diffusion regions 222 can, in one embodiment, provide emitter regions for the solar cell 200B. Thus, in an embodiment, the conductive contacts 228 are disposed on the emitter regions. In an embodiment, the conductive contacts 228 are back contacts for a back-contact solar cell and are situated on a surface of the solar cell opposing a light receiving surface, such as opposing a texturized light receiving surface 201, as depicted in FIG. 2B.

Referring again to FIG. 2B, each of the conductive contacts 228 includes a conductive layer 230 in contact with the emitter regions of the solar cell 200B. In an embodiment, the conductive layer 230 of contact 228 is composed of a metal paste portion mixed with an adhesion layer portion. In one such embodiment, the adhesion layer portion is composed of a bottom anti-reflective coating (BARC) portion. In a specific such embodiment, the adhesion layer portion further includes a passivation layer portion, e.g., in a particular embodiment, the BARC portion is composed of amorphous silicon, and the passivation layer portion is composed of silicon nitride. In another embodiment, the adhesion layer portion is composed of a material such as, but not limited to, amorphous silicon (a-Si), doped silicon, silicon-rich silicon nitride, silicon dioxide ($SiO_2$) or silicon oxynitride (SiON). In an embodiment, the metal paste portion is composed of aluminum (Al) and the adhesion layer portion is composed silicon (Si), and the resulting conductive layer is composed of an Al—Si alloy. In yet another embodiment, the adhesion layer portion is composed of a polymer glue. In another embodiment, the emitter regions are the N-type emitter regions, and the adhesion layer portion is composed of P-type silicon.

In an embodiment, the metal paste portion has a total composition including approximately 10-30% binders and frit, with the remainder the Al/Si particles. In one such embodiment, the binders are composed of zinc oxide (ZnO), tin oxide (SnO), or both, and the frit is composed of glass particles. It is to be understood that, when initially applied, a metal paste portion can further include a solvent. However, the solvent can be removed upon annealing the metal paste portion, leaving essentially the binders, frit and Al/Si particles mixed with the adhesion layer portion and disposed on the diffusion regions 220 and 222. In an embodiment, an electroless plated nickel (Ni) layer 232 is disposed on the conductive layer 230, and an electroplated copper (Cu) layer 234 is disposed on the Ni layer, as depicted in FIG. 2B.

Although certain materials are described specifically above, some materials may be readily substituted with others with other such embodiments remaining within the spirit and scope of embodiments of the present invention. For example, in an embodiment, a different material substrate, such as a group III-V material substrate, can be used instead of a silicon substrate. In another embodiment, silver (Ag) particles or the like can be used in a seed paste instead of, or in addition to, Al particles. In another embodiment, plated or like-deposited cobalt (Co) or tungsten (W) can be used instead of or in addition to the plated Ni described above.

Furthermore, the formed contacts need not be formed directly on a bulk substrate, as was described in FIG. 2B. For example, in one embodiment, conductive contacts such as those described above are formed on semiconducting regions formed above (e.g., on a back side of) a bulk substrate, as was described for FIG. 2A. As an example, FIGS. 3A-3C illustrate cross-sectional views of various processing operations in a method of fabricating solar cells having conductive contacts, in accordance with an embodiment of the present invention.

Figure 3A:
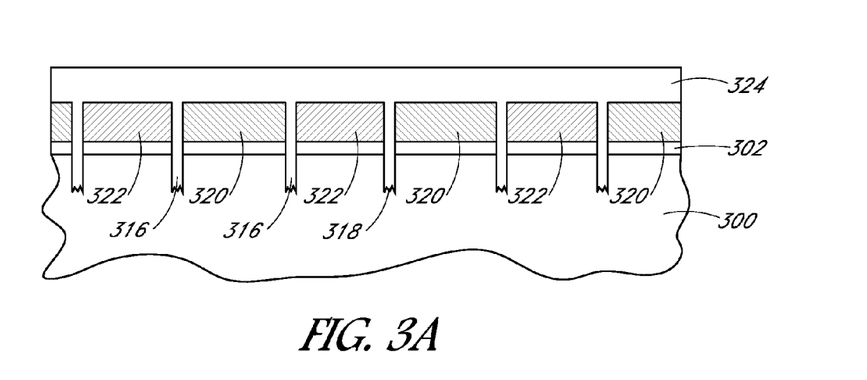
FIGS. 3A-3C illustrate cross-sectional views of various processing operations in a method of fabricating solar cells having conductive contacts, in accordance with an embodiment of the present invention.
Figure 3B:
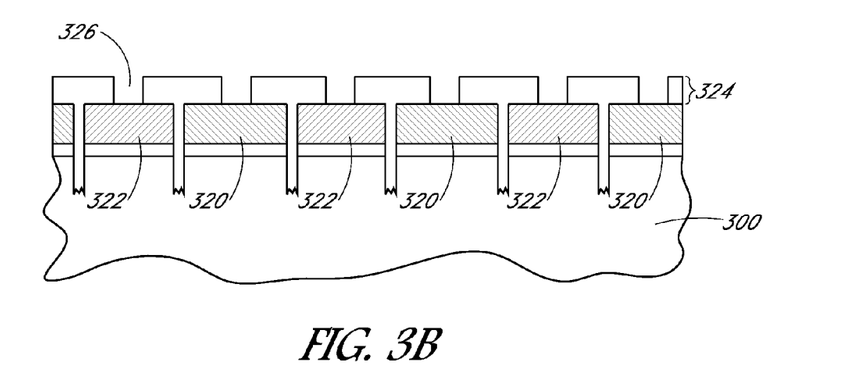
Figure 3C:
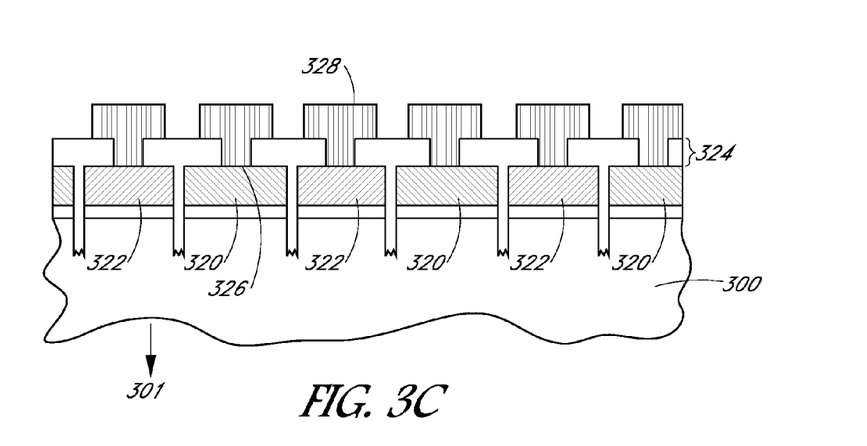

Referring to FIG. 3A, a method of forming contacts for a back-contact solar cell includes forming a thin dielectric layer 302 on a substrate 300.

In an embodiment, the thin dielectric layer 302 is composed of silicon dioxide and has a thickness approximately in the range of 5-50 Angstroms. In one embodiment, the thin dielectric layer 302 ultimately performs as a tunneling oxide layer in a functioning solar cell. In an embodiment, substrate 300 is a bulk single-crystal substrate, such as an n-type doped single crystalline silicon substrate. However, in an alternative embodiment, substrate 300 includes a polycrystalline silicon layer disposed on a global solar cell substrate.

Referring again to FIG. 3A, trenches 316 are formed between n-type doped polysilicon regions 320 and p-type doped polysilicon regions 322. Portions of the trenches 316 can be texturized to have textured features 318, as is also depicted in FIG. 3A.

Referring again to FIG. 3A, a insulating layer 324 is formed above the plurality of n-type doped polysilicon regions 320, the plurality of p-type doped polysilicon regions 322, and the portions of substrate 300 exposed by trenches 316. In one embodiment, a lower surface of the insulating layer 324 is formed conformal with the plurality of n-type doped polysilicon regions 320, the plurality of p-type doped polysilicon regions 322, and the exposed portions of substrate 300, while an upper surface of insulating layer 324 is substantially flat, as depicted in FIG. 3A.

Referring to FIG. 3B, a plurality of contact openings 326 are formed in the insulating layer 324. The plurality of contact openings 326 provide exposure to the plurality of n-type doped polysilicon regions 320 and to the plurality of p-type doped polysilicon regions 322. In one embodiment, the plurality of contact openings 326 is formed by laser ablation. In one embodiment, the contact openings 326 to the n-type doped polysilicon regions 320 have substantially the same height as the contact openings to the p-type doped polysilicon regions 322, as depicted in FIG. 3B.

Referring to FIG. 3C, the method of forming contacts for the back-contact solar cell further includes forming conductive contacts 328 in the plurality of contact openings 326 and coupled to the plurality of n-type doped polysilicon regions 320 and to the plurality of p-type doped polysilicon regions 322. In an embodiment, the conductive contacts 328 are composed of metal and are formed by a deposition (the deposition described in greater detail below), lithographic, and etch approach.

Thus, in an embodiment, conductive contacts 328 are formed on or above a surface of a bulk N-type silicon substrate 300 opposing a light receiving surface 301 of the bulk N-type silicon substrate 300. In a specific embodiment, the conductive contacts are formed on regions (322/320) above the surface of the substrate 300, as depicted in FIG. 3C. The fabrication of the conductive contacts can involve use of a mixture of an adhesion layer and a metal seed paste layer that forms by subjecting a paste layer/adhesion layer stack to and annealing process. Forming the conductive contacts can further include forming an electroless plated nickel (Ni) layer on the metal seed layer. Additionally, a copper (Cu) layer can be formed by electroplating on the Ni layer.

In an embodiment, forming the conductive layer involves first forming an adhesion layer on or above a substrate. The adhesion layer can be formed from a bottom anti-reflective coating (BARC) layer. In one such embodiment, the adhesion layer is composed of a layer of material such as, but not limited to, amorphous silicon (a-Si), doped silicon, silicon-rich silicon nitride, silicon dioxide ($SiO_2$) or silicon oxynitride (SiON). In a specific such embodiment, the adhesion layer is formed from a layer of P-type silicon. Forming the conductive layer next involves forming a metal seed paste layer on the adhesion layer. The metal seed paste layer can be composed of aluminum/silicon (Al/Si) particles, binders, frit, and a solvent. In one such embodiment, the Al/Si particles are composed of less than approximately 25% Si, with the remainder of the composition made up by Al. In one embodiment, if included, the binders can be composed of zinc oxide (ZnO), tin oxide (SnO), or both, and the frit can be composed of glass particles. Forming the conductive layer finally involves annealing the metal seed paste layer and the adhesion layer to form the conductive layer in contact with the emitter region of the substrate. Annealing the metal seed paste layer and the adhesion layer can involve mixing the metal seed paste layer and the adhesion layer. In one such embodiment, the annealing involves firing at a temperature below approximately 600 degrees Celsius.

In another aspect, embodiments are directed to improving ohmic contact between aluminum particles and Si at low firing temperatures. In one such embodiment, at least one of the elements of calcium (Ca), cerium (Ce), or magnesium (Mg) is added to the aluminum particles. By adding one or more of these species, potential to form native aluminum oxide barriers are reduced, ensuring intimate contact between the aluminum particles and Si for lower contact resistance. More generally, silicon from a device substrate or emitter can rapidly dissolve into aluminum during firing unless the aluminum contains sufficient silicon. To prevent Si pitting in substrate, a certain percentage of Si is alloyed in aluminum particle as well. Exact Si concentration within aluminum particle depends on firing temperature, alloy uniformity and firing dynamics. For example, 1% to 25% Si can be added to the aluminum particles for firing temperature between 300 C-600 C. Additionally, or alternatively, 0%-10% Mg and/or 0%-20% Ca and/or 0%-20% Ce can be added to the aluminum particles. In a specific such embodiment, addition of 0.5%-2% is typically sufficient to react with native aluminum oxide and ensure ohmic contact.

In an embodiment, a low-firing aluminum paste can be composed of the aluminum particles mentioned above, as well as additional matrix materials. Matrix materials can include glass based or oxide based compounds, which are first softened to flow at firing temperatures. Also, such matrix materials can provide good adhesion with a substrate surface, such as silicon nitride, silicon oxide or silicon oxy-nitride. The paste as mentioned can be applied for metallization for solar cells including front contact and back contact solar cells, and fired at low temperature (e.g., approximately in the range of 300-600 degrees Celsius). The paste as designed can provide intimate ohmic contact, low damage to substrate junction/lifetime, and good adhesion.

In another aspect, multi-pulse laser ablation is used for a multilayer film stack. For example, in order to ablate a dielectric stack with an additional absorptive layer on top, a different type of multi-pulse laser can be used. In one such embodiment, a less powerful first pulse but more powerful second pulse is used. The first pulse is mostly absorbed by the top absorptive layer and openings within the layer are formed. Then, the second pulse is absorbed by an underlying silicon substrate at the same location, and an overlying dielectric stack is ablated. In a specific embodiment, a third or more pulses can be used after the second pulse to improve the quality of the openings and minimize the damage to silicon substrate.

More specifically, the above approach can be applied to solar cells when having multi-film bARC layers with absorptive layers on top, such as a-Si or Si-rich SiN layers. A pulse laser has been successfully applied to open via holes in a dielectric film on top of an absorptive substrate. For example, contact openings can be formed in a bARC layer with minimum damage to an underlying substrate wafer. In a specific embodiment, a dielectric film of silicon oxide and/or silicon nitride is formed as a bARC layer on top of the silicon substrate. A laser wavelength can be selected such that laser power is absorbed by the surface of silicon substrate. Subsequent evaporation of silicon from the surface ablates off the dielectric layer above. For comparison, both single-pulse laser and multi-pulse laser have been used for such a process. Usually, multi-pulse laser usage involves the first pulse being the most powerful pulse, followed by pulses of attenuating power. However, such a multi-pulse approach does not work well when an additional absorptive layer is formed on top of dielectric layer, e.g., an overlying amorphous silicon layer or Si-rich SiNx layer. Since the top absorptive layer absorbs a significant amount of power, both single and multiple pulse laser either have difficulty opening holes all the way to silicon substrate, or generating too much damage to the silicon substrate.

In an embodiment, in order to overcome the above issues, a different type of multi-pulse laser is used. Specifically, instead of using multi-pulse laser with the first pulse most powerful, a less powerful first pulse but more powerful second pulse can be used. The first pulse will be mainly absorbed by top absorptive layer and openings within this layer are formed due to evaporation, and then the second pulse will be absorbed by silicon substrate at the same location and dielectric stack above is ablated. Additional pulses can be used after the second pulse to improve the quality of the openings and minimize the damage to silicon substrate. As an example, FIG. 4 illustrates a process of multi-pulse laser ablation for multilayer film stacks undergoing contact opening, in accordance with an embodiment of the present invention.

Figure 4:
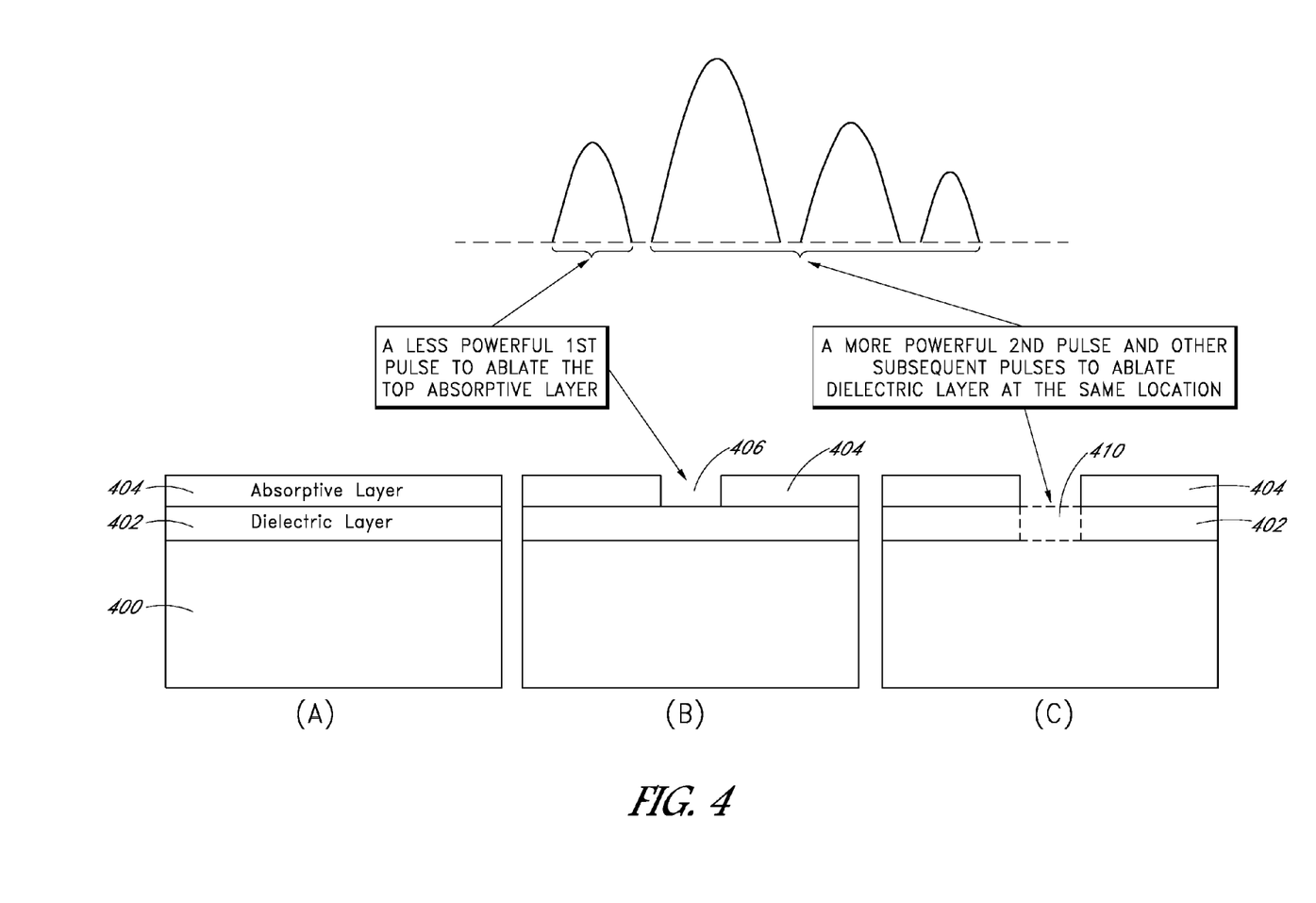
FIG. 4 illustrates a process of multi-pulse laser ablation for multilayer film stacks undergoing contact opening, in accordance with an embodiment of the present invention.

Referring to FIG. 4, part (A), a material stack for forming contact opening therein includes an absorptive layer 404 (such as a-Si or Si-rich $SiN_x$) disposed on a dielectric layer 402 (such as $SiO_2$ or $SiN_x$) disposed on a silicon substrate (or, alternatively, on a polysilicon layer above a silicon substrate). Referring to part (B) of FIG. 4, a less powerful first pulse is used to ablate the top absorptive layer 404, forming an initial opening 406. Referring to part (C) of FIG. 4, a more powerful second pulse and, possibly, additional subsequent pulses are used to ablate the dielectric layer 402 at the same location, forming complete opening 410. In an embodiment, a conductive contact can then be formed in the complete opening 410.

In another aspect, a multi-layer bARC is used to improve metal paste adhesion at low firing temperature. The multi-layer bARC structure can include a passivation layer (SiN) and another adhesion layer on top of SiN on the device side for metal paste. The adhesion layer can be a-Si, Si-rich SiN (high n), $SiO_2$, SiON, and so on, which can be deposited by PECVD together with SiN layer. In an embodiment, an advantage of multi-layer bARC is to decouple passivation layer and adhesion layer, and allow optimization of different layers for different functions. The bARC layer can also be gradually changed from one composition to another composition during deposition. Some level of surface treatment can be applied before metal paste printing, such mono-layer treatment, heating or roughing. Embodiments of the invention can also be applied for sputtering metal seed and front contact solar cells. Single layer a-Si bARC can also be considered as another option, which can provide passivation for cell and adhesion to the aluminum paste at the same time. In an embodiment, an aluminum paste shows significant improvement of adhesion (from <1N to >10N) on a-Si surface when fired around 580 C-600 C. A continuous aluminum layer can be formed under an entire printing area by alloying between aluminum particle and a-Si layer. Meanwhile, Si-rich SiN shows appreciable improvement of adhesion as well, but less effective than an a-Si layer.

In another aspect, an approach for improving adhesion of metal paste on a silicon substrate for solar applications involves use of a polymer glue. The polymer glue can be applied on the back side of a wafer after firing of a metal paste seed layer, such that the polymer glue fills up the porous structure within the paste and also makes contact with the substrate wafer or other emitter region. In an embodiment, a polymer glue aids in holding particles together and also holding paste on the substrate wafer after a cure process. A top layer of the polymer glue can be removed by immersing the wafer in solvent to expose metal surface, enabling subsequent plating on exposed printed metal lines. In one embodiment, the polymer glue layer provides a sufficient enough barrier for moisture that use of a bARC SiN layer can be removed from cell fabrication process.

As a comparison, for conventional Al pastes for solar cells, Al pastes are printed on silicon surface and fired at high temperature (e.g., approximately in the range of 700-800 degrees Celsius). However, such processing of the paste can damage passivation and create Si pitting when fired at high temperature. The use of printed aluminum paste to replace sputtering seed can involves printing aluminum paste on an SiN passivation layer except where contact openings exist. The paste can be fired at low firing temperatures (e.g., less than approximately 600 degrees Celsius) to mitigate damage to wafer lifetime and device structure. However, good adhesion can be difficult to achieve under such conditions.

Instead, in accordance with an embodiment of the present invention, a metal paste layer (e.g., aluminum paste) is printed and fired at low temperature (e.g., approximately in the range of 300-600 degrees Celsius) such that ohmic contact is formed between the paste and silicon within contact openings of an emitter region. A polymer glue is then applied on the back side of wafer. The polymer glue is used to flow into and occupy the porous structure within the paste and also to make contact with the emitter region. The metal paste itself can also be formulated differently to improve contact resistance and control porosity to further enable polymer flow and fill. The process to apply polymer glue above a wafer can depend on polymer material properties. In one embodiment, a polymer glue is applied at elevated temperature to enhance flowing and then cured over time. A polymer can, however, instead be applied at room temperature to occupy porous paste and then be cured at elevated temperatures. The wafer can then be immersed in a solvent with controlled time to remove a top layer of the polymer glue and to expose the metal surface of the paste for subsequent plating on printed metal lines.

As an example, FIGS. 5A-5E illustrate cross-sectional views of various processing operations in a method of fabricating solar cells having conductive contacts, in accordance with an embodiment of the present invention.

Figure 5A:
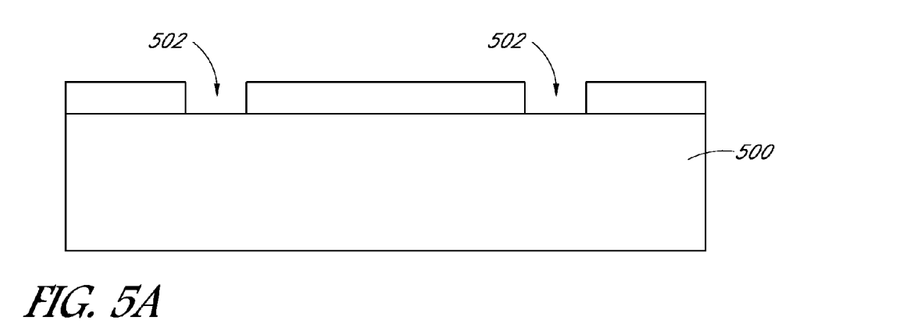
FIGS. 5A-5E illustrate cross-sectional views of various processing operations in a method of fabricating solar cells having conductive contacts, in accordance with an embodiment of the present invention.
Figure 5B:
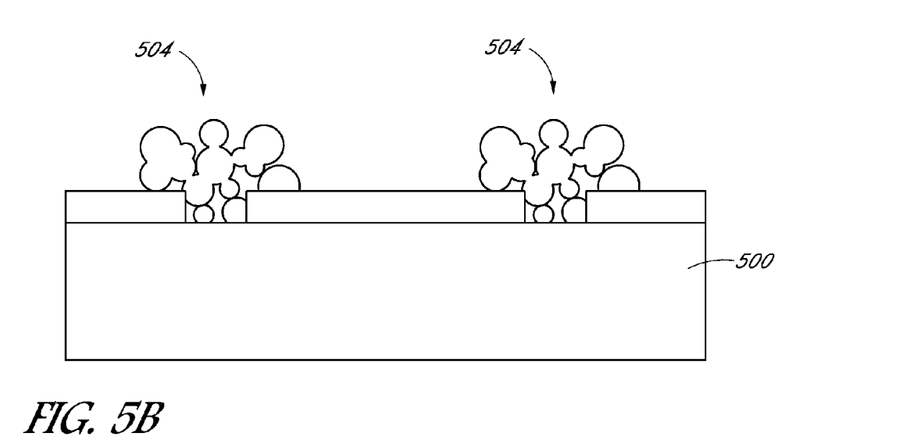
Figure 5C:
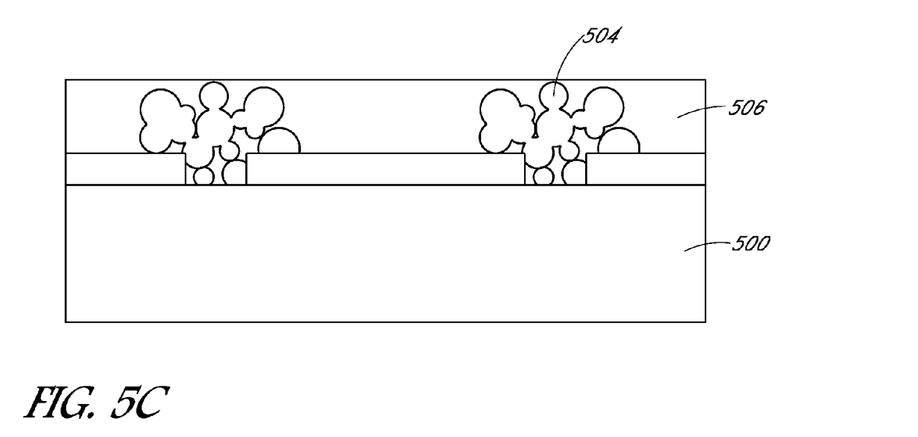
Figure 5D:
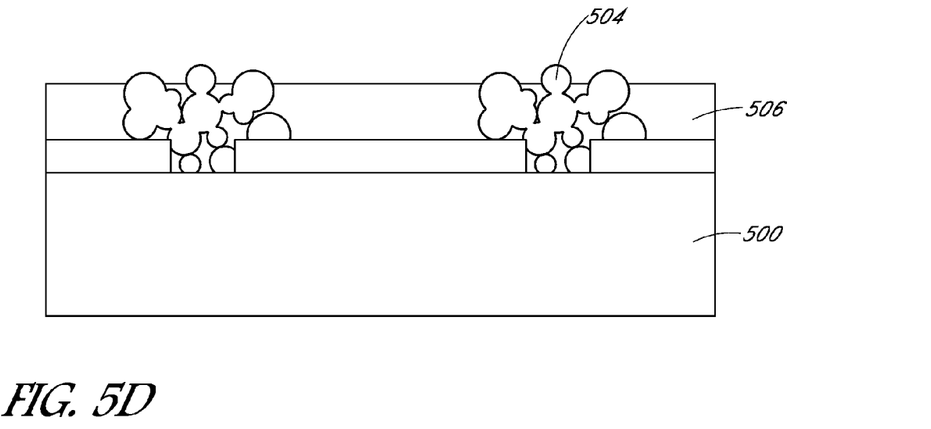
Figure 5E:
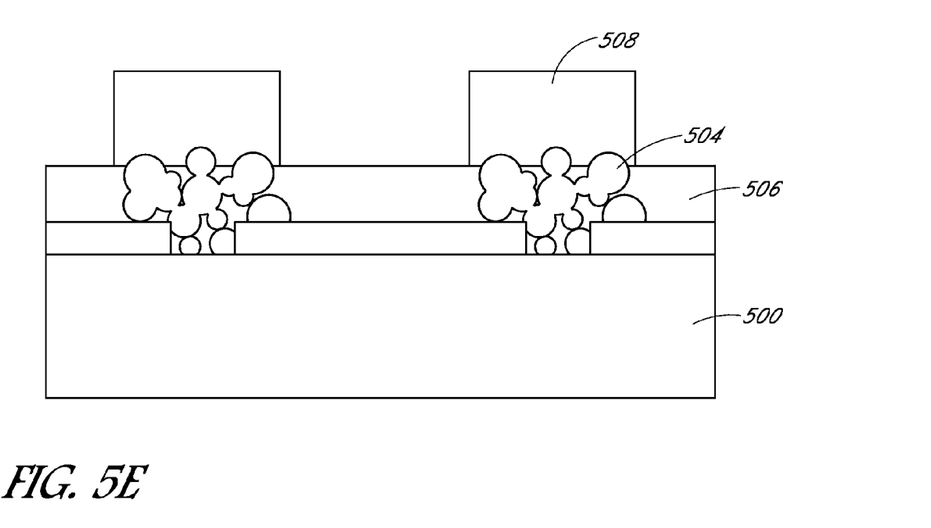

Referring to FIG. 5A, a solar cell 500 is fabricated to have contact openings 502 (e.g., in a dielectric or passivation layer) thereon. A metal paste 504 is then printed and fired to form ohmic contact with silicon (e.g., from substrate 500), as depicted in FIG. 5B. Referring to FIG. 5C, a polymer glue 506 is coated over the metal paste 504. The polymer glue can then be cured. A top layer or portion of the polymer glue 506 is then dissolved to expose the printed metal seed 504, as depicted in FIG. 5D. Referring to FIG. 5E, a metal layer 508 or layers are then formed on the exposed printed metal seed 504.

Thus, in an embodiment, a method of fabricating a solar cell includes forming a metal seed paste layer on an emitter region of a substrate. The metal seed paste layer is treated to increase adhesion of the metal seed paste layer on the emitter region of the substrate. Subsequently, a conductive contact for the solar cell is formed from the metal seed paste layer. In one such embodiment, treating the metal seed paste layer involves forming a polymer glue layer on the metal seed paste layer. In a specific such embodiment, the method further includes removing an excess amount of the polymer glue layer prior to forming the conductive contact. In one embodiment, the method further includes, prior to forming metal seed paste layer on the emitter region, forming a dielectric stack above the emitter region, and forming an opening in the dielectric stack to expose a portion of the emitter region. In a specific such embodiment, forming the opening involves using a multi-pulse laser ablation process. In a particular embodiment, forming the dielectric stack involves forming a dielectric layer on the emitter region. The dielectric layer is composed of silicon oxide or silicon nitride. An absorptive layer is then formed on the dielectric layer. The absorptive layer is composed of amorphous silicon or silicon-rich silicon nitride. In an embodiment, forming the conductive contact further involves electroless plating a nickel (Ni) layer on the metal seed paste layer, and electroplating a copper (Cu) layer on the Ni layer.

Referring again to FIG. 5A-5E, the illustrated process decouples the requirement for ohmic contact and adhesion. Ohmic contact is determined by metal paste and firing processing, while adhesion is provided by polymer glue and cure processing. The cure temperature can be much lower than the firing temperature. The use of a polymer glue aids in holding particles together and also holding paste on the substrate wafer.

Thus, enhanced adhesion of seed layers for solar cell conductive contacts and methods of forming solar cell conductive contacts have been disclosed. In accordance with an embodiment of the present invention, a method of fabricating a solar cell includes forming an adhesion layer above an emitter region of a substrate. A metal seed paste layer is formed on the adhesion layer. The metal seed paste layer and the adhesion layer are annealed to form a conductive layer in contact with the emitter region of the substrate. A conductive contact for the solar cell is formed from the conductive layer. In one embodiment, annealing the metal seed paste layer and the adhesion layer involves mixing the metal seed paste layer and the adhesion layer to form the conductive layer.

What is claimed is:

1. A solar cell, comprising:
a substrate;
an N-type emitter region disposed above the substrate; and
a conductive contact disposed on and electrically connected to the N-type emitter region, the conductive contact comprising a mixture of a metal paste portion and a P-type silicon portion, the metal paste portion and the P-type silicon portion of the mixture in contact with the N-type emitter region.

2. The solar cell of claim 1, wherein the metal paste portion comprises aluminum (Al), and the mixture comprises an Al-Si alloy.

3. The solar cell of claim 1, wherein the mixture has a thickness of approximately 2-10 microns, and wherein the conductive contact is a back contact of the solar cell comprising the mixture, an electroless plated nickel (Ni) layer disposed on the mixture, and an electroplated copper (Cu) layer disposed on the Ni layer.

4. A solar cell, comprising:
   a substrate having an N-type diffusion region at or near a surface of the substrate; and
   a conductive contact disposed above and electrically connected to the N-type diffusion region, the conductive contact comprising a mixture of a metal paste portion and a P-type silicon portion, the metal paste portion and the P-type silicon portion of the mixture in contact with the N-type diffusion region.

5. The solar cell of claim 4, wherein the metal paste portion comprises aluminum (Al), and the mixture comprises an Al-Si alloy.

6. The solar cell of claim 4, wherein the mixture has a thickness of approximately 2-10 microns, and wherein the conductive contact is a back contact of the solar cell comprising the mixture, an electroless plated nickel (Ni) layer disposed on the mixture, and an electroplated copper (Cu) layer disposed on the Ni layer.

7. A method of fabricating solar cell, the method comprising:
   forming an adhesion layer above an N-type emitter region of a substrate;
   wherein the adhesion layer comprises P-type silicon; and
   subsequent to forming the adhesion layer above the N-type emitter region, forming a metal seed paste layer on the adhesion layer;
   annealing the metal seed paste layer and the adhesion layer to form a conductive mixture layer in contact with the N-type emitter region of the substrate;
   wherein the metal paste portion and the P-type silicon portion of the mixture in contact with the N-type emitter region; and
   forming a conductive contact for the solar cell from the conductive layer.

8. The method of claim 7, wherein annealing the metal seed paste layer and the adhesion layer comprises mixing the metal seed paste layer and the adhesion layer to form the conductive layer.

9. The method of claim 7, wherein forming the metal paste portion comprises aluminum (Al), and the mixture comprises an Al-Si alloy.

10. The method of claim 7, wherein the conductive layer has a thickness of approximately 2-10 microns, and wherein forming the conductive contact comprises forming a back contact of the solar cell comprising the conductive layer, an electroless plated nickel (Ni) layer formed on the conductive layer, and an electroplated copper (Cu) layer formed on the Ni layer.

* * * * *